United States Patent [19]

Patton

[11] Patent Number: 4,933,285
[45] Date of Patent: Jun. 12, 1990

[54] MULTIPLE MONOLAYERS OF POLYMERIC LINKAGES ON A SOLID PHASE FOR IMMOBILIZING MACROMOLECULES

[75] Inventor: Jesse C. Patton, Ellicott City, Md.

[73] Assignee: Environmental Technologies Group, Inc., Md.

[21] Appl. No.: 289,417

[22] Filed: Dec. 21, 1988

Related U.S. Application Data

[63] Continuation of Ser. No. 916,337, Oct. 7, 1986, abandoned.

[51] Int. Cl.$^5$ .................. C12N 11/06; C12N 11/02; G01N 33/544; C07K 17/06
[52] U.S. Cl. .................. 435/181; 435/176; 435/177; 435/178; 436/528; 530/816
[58] Field of Search ............ 435/174, 176, 177, 178, 435/179, 181; 530/816; 436/528

[56] References Cited

U.S. PATENT DOCUMENTS

| | | | |
|---|---|---|---|
| 3,741,871 | 6/1973 | Weeks et al. | 435/179 |
| 4,177,038 | 12/1979 | Biebricher et al. | 435/179 X |
| 4,279,998 | 7/1981 | Shahani et al. | 435/181 X |
| 4,506,015 | 3/1985 | Ho et al. | 435/176 X |
| 4,656,252 | 4/1987 | Giese | 435/181 X |

OTHER PUBLICATIONS

R. B. Merrifield, "Solid-Phase Peptide Synthesis", Biochemistry, vol. 3, No. 9, Sep., 1964.
J. Am. Chem. Soc. 1983, 105, pp. 674–676, A New Approach to Construction of Artificial Monolayer Assemblies, L. Netzer and J. Sagiv.

Primary Examiner—David M. Naff
Attorney, Agent, or Firm—Leonard Bloom

[57] ABSTRACT

The present invention provides a process for building an immobilized structure comprising multiple monolayers of effective sequential polymeric linkages. The multiple monolayers are built, monolayer by monolayer, from the surface of a solid phase, by an alternating reaction sequence conducted with multifunctional reagents. The process provides the capability of building numerous immobilized multiple monolayer structures wherein the length of each structure extending from a solid phase is substantially the same. Structures comprising multiple monolayers of polymeric linkages are useful for many purposes, as for example, immobilizing macromolecules or other biomolecules and the like to produce chemical or biochemical sensors. Other uses extend to molecular electronic applications, such as the production of molecular conductive wires and molecular circuitry. In a preferred embodiment, carbonyldiimidazole and phenylenediamine are the multifunctional reagents and multiple monolayers of phenylurethane linkages are produced.

6 Claims, 3 Drawing Sheets

MULTIPLE MONOLAYERS OF POLYMERIC LINKAGES ON A SOLID PHASE FOR IMMOBILIZING MACROMOLECULES

This application is a continuation, of application Ser. No. 16,337, filed 10/07/86 now abandoned.

FIELD OF THE INVENTION

This invention relates to a process for building multiple monolayers of polymeric linkages wherein the length of each of the resulting multiple monolayer structures can be controlled so that they may be substantially the same. Structures comprising multiple monolayers of polymeric linkages are useful for many purposes, as for example chemical or biochemical sensors, molecular conductive wires, and the like.

BACKGROUND OF THE INVENTION

The assembling of molecular layered structures has gained recognition in the past, primarily in the context of solid phase synthesis of peptides. R. B. Merrifield reports in *Biochemistry*, Vol. 3, No. 9 pp. 1385-1390 (1964), the stepwise synthesis of the naturally occurring nonapeptide bradykinin, by attachment of a terminal amino acid to a substrate, a decarboxylation step, and then a coupling step wherein an amino acid residue is attached to the terminal amino acid. The steps are repeated until a peptide with nine amino acid residues is produced.

More recently, this approach to protein synthesis has been expanded to the production of a multilayer film of 1,5-hexadecenyl-trichlorosilane. Lucy Metzer and Jacob Sagiv in *J. Am. Chem. Soc.*, Vol. 105, pp. 674–676 (1983) report a two-step sequence consisting of monolayer absorption, followed by chemical activation of the exposed surface to provide polar absorption sites for the anchoring of the next monolayer.

SUMMARY OF THE INVENTION

The present invention provides a process for building an immobilized structure comprising multiple monolayers of "effective sequential polymeric linkages," said process comprising the steps of:

(a) providing a solid phase with a first attached "reactive moiety";

(b) conducting a first coupling reaction by reacting said attached "reactive moiety" with an excess of a first multifunctional reagent or combination of reagents, said reagent or combination of reagents comprising a first functional group or groups reactive with said first reactive moiety and a second functional group or groups reactive with a second multifunctional reagent or combination of reagents; said coupling reaction producing a first intermediate adduct derived from said first reagents and attached to said solid phase, said adduct comprising a residue and a second reactive moiety capable of coupling to the second multifunctional reagent;

(c) conducting a second coupling reaction by reacting said first intermediate adduct with an excess of the second multifunctional reagent, to form a first molecular unit comprising a residue derived from said first intermediate adduct and a residue from said second reagent, said molecular unit capable of reacting with said first multifunctional reagent;

(d) repeating said first coupling and second coupling reactions alternatively to produce an immobilized structure comprising multiple monolayers of "effective sequential polymeric linkages".

The process provides the capability of building numerous immobilized multiple monolayer structures wherein the length of each structure extending from the substrate is substantially the same.

Another aspect of the invention relates to the immobilized structures prepared in accordance with the process.

"Effective sequential polymeric linkages" within the context of the invention are at least two molecular units, sequentially bonded, preferably having either conjugated moieties capable of acting as conductive or semiconductive molecular entities through a pi ($\pi$) bond delocalization; or unconjugated moieties that are not conductive, and thus capable of acting as resistive molecular entities. In either of the preferred cases, biomolecules or other macromolecules and the like may also be immobilized by physical or covalent bonding to terminal functional groups of the multiple monolayer structures.

The solid phase in the present invention is one that has a "reactive moiety" available on a surface that is capable of reacting with the first multifunctional reagent and incorporating at least a part of that reagent to form an immobilized intermediate adduct having a second reactive moiety capable of reacting with the second multifunctional reagent.

In the context of the invention, a "reactive moiety" is a molecular moiety that has the capability of reacting with another moiety via classical functional group organic chemistry. Of these may be mentioned such moieties as amino groups, carboxylic acids, carbonylimidazoles, aldehydes, carboxyacid halides, carboxylated esters, carboxylated anhydrides, alcohols or phenols, and the like; of which amino groups and carbonylimidazoles are preferred due to their high reactivity.

DETAILED DESCRIPTION OF THE INVENTION

Figure 1:
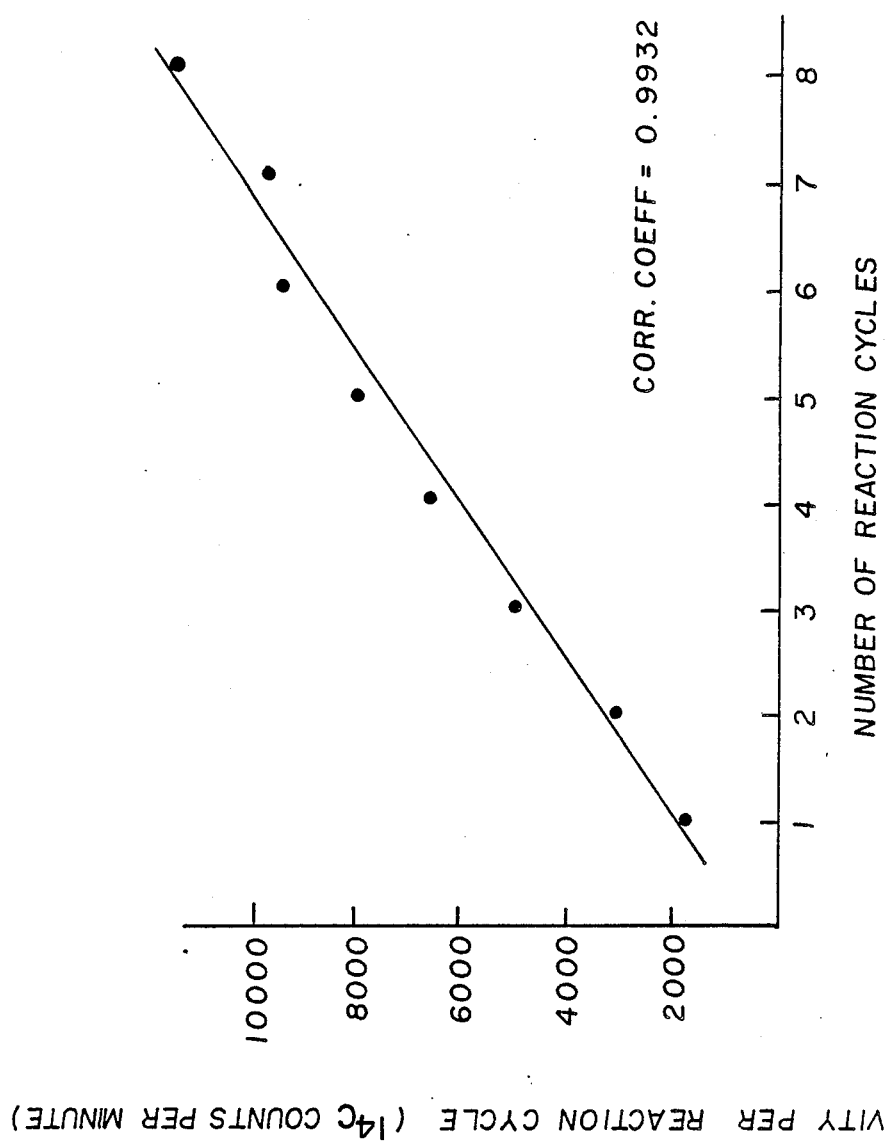
FIG. 1 is a plot of the radioisotopic data obtained after each complete reaction cycle adding a successive monolayer of phenylurethane.

In the process of the present invention, an immobilized structure comprising multiple monolayers of effective sequential polymeric linkages is built, monolayer by monolayer, from the surface of a solid phase, by an alternating reaction sequence conducted with multifunctional reagents.

According to the method of the invention, a solid phase with a first attached reactive moiety is contacted with a first multifunctional reagent or combination of reagents. The method of contact may be by any means that allows the reactants to come into contact with the solid phase.

For example, the substrate containing the reactive moiety may he reacted with the chosen first multifunctional reagent or combination of reagents in a conventional manner in the vapor state or by simply mixing the reactants together in a liquid state. When the reaction is carried out in the liquid state, conventional solvents are often employed. In some cases, the multifunctional reagent may be susceptible to hydrolysis, and thus, an aprotic solvent should be employed It is generally preferred to employ an excess of the multifunctional reagent to avoid bimolecular termination reactions which produce products on the solid phase which will interfere with the desired building of the polymeric monolayers.

Successful completion of the first coupling reaction will result in an intermediate adduct containing at least a part of the first reagent, the adduct terminating with at least one second reactive moiety. At this time it is often preferred to employ an additional step of removing unreacted first multifunctional reagents, usually by conventional washing techniques.

In the second coupling step of the present method, the substrate now having the intermediate adduct affixed to it is reacted in a similar fashion with a second multifunctional reagent or a combination thereof. During this step, at least a portion of the second reagent or combination of reagents is incorporated, producing one monolayer of the desired polymeric linkage, this monolayer terminating with at least one moiety capable of reacting with the first multifunctional reagent, and thus repeating the cycle to produce a second monolayer, and so on. The reaction cycles may be repeated in this alternate manner to produce the desired number of monolayers, with the terminal end of the overall structure ending with at least one reactive moiety belonging to either one of the two types of reactive moieties generated.

Solid phases having reactive moieties attached to their surfaces useful in the practice of the invention can be any solid material that can act as a substrate for attachment of the multiple monolayers, and serves to anchor the reaction products to a solid phase and permit the unreacted multifunctional reagents in each step to be efficiently removed prior to the next reactive step with another multifunctional reagent. Selection of these substrates may be governed in part by their physical and chemical properties, such as solubility, functional groups, mechanical stability, surface area swelling propensity, hydrophobic or hydrophilic properties, and the like; as well as their electrical properties, such as conductivity, resistivity, and the like.

Essentially three major types of substrates are most preferred: inorganics, natural polymers, and synthetic polymers. Of these may be mentioned polymers such as polyvinylalcohols, acrylates and acrylic acids such as polyethylene-co-acrylic acid, polyethylene-co-methacrylic acid, polyethylene-co-ethylacrylate, polyethylene-co-methyl acrylate, polypropylene-co-acrylic acid, polypropylene-co-methyl-acrylic acid, polypropylene-co-ethylacrylate, polypropylene-co-methyl acrylate, polyethylene-co-vinyl acetate, polypropylene-co-vinyl acetate, and the like; and those containing acid anhydride groups such as polyethylene-co-maleic anhydride, polypropylene-co-maleic anhydride and the like; and natural polymers such as polypeptides, proteins and carbohydrates; metalloids that have semiconductive properties such as silicon, germanium, aluminum, and the like; and metals such as platinum, gold, nickel, copper, zinc, tin, palladium, silver. Particularly useful are oxides of the metal and metalloids such as Pt-PtO, Si-SiO, Au-AuO, $TiO_2$, Cu-CuO, and the like. Inorganics having conductive or semiconductive properties are preferred in some embodiments of the invention. Of these may be mentioned silicon/silicon oxide semiconductor elements, or other semiconductor elements such as lithium niobate, galluim arsenide, indium phosphide, and the like.

Substrates such as those mentioned above, particularly the metalloids, may be treated to contain an appropriate reactive moiety or in some cases may be obtained commercially already containing the reactive moiety. Materials containing reactive surface moieties such as amino silane linkages, hydroxyl linkages, or carboxysilane linkages are preferred in some embodiments of the invention and may be produced by well established surface chemistry techniques involving silanization reactions, or the like. Examples of these materials are those having surface silicon oxide moieties, covalently linked to gamma-aminopropylsilane, and other organic moieties; N-[3-(triethyoxysilyl) Propyl]Phthelamic acid; and Bis-(2-Hydroxyethyl)aminopropyltriethoxysilane. Exemplary of readily available materials containing $NH_2$ reactive functionalities are para-aminophenyltriethyoxysilane and gamma-aminopropyl silanized Controlled Porous Glass Beads, available from Pierce Chemical Co., P.O. Box 117, Rockford, Ill. 61105.

The multifunctional reagents useful in the process of the invention are those that can react in alternate manner to produce at least one molecular unit of the desired effective polymeric linkage, the alternate reaction scheme capable of repetition until the desired number of molecular units are produced. Combinations of first and second multifunctional reagents may be varied to obtain a wide variety of polymeric linkages with electrical properties ranging from nonconductive to semiconductive and conductive. Terminal functional groups of the resulting multiple monolayer structure may be further reacted with biomolecules, other macromolecules, and the like. Combinations of first multifunctional agents may also be used in conjunction with combinations of second multifunctional reagents to produce branched polymeric linkages and the like.

In general, at least a part of the first multifunctional reagent or combination of reagents is incorporated into the immobilized molecular unit, producing an intermediate adduct with at least one terminal functional group that is capable of reacting with the second multifunctional reagent. Upon reaction with the second multifunctional reagent or combination of reagents, at least a portion of that second reagent is incorporated into the immobilized structure, producing one complete molecular unit with at least one terminal group capable of reacting with the first multifunctional reagent. The cycle may then be repeated. It is generally preferred that the terminal group or groups of a completed molecular unit be the same reactive moiety as that originally provided on the substrate.

The first multifunctional reagent or combination of reagents in the present process is selected according to the type of multiple monolayer structure it is desired to achieve, and may be heterofunctional or homofunctional. The first reagent or combination thereof is capable of reacting with the reactive moiety attached to the solid phase.

Illustrative of multifunctional reagents suitable for use as the first reagent whether alone or in combination may be mentioned those that react with the substrate moiety via nucleophiliac displacement and may be represented by the following general formula I:

I wherein R is readily displaced by nucleophiles, and is preferably aromatic heterocyclic or halogen.

A further illustration of reagents suitable as the first multifunctional reagents are those capable of reacting with the substrate reactive moiety via a condensation-/elimination scheme, and may be represented by the general formulae II and III:

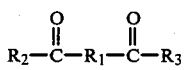

II wherein $R_1$ is phenyl, polyphenyl, fused ring aromatic, alkyl, alkene, aromatic heterocyclic, metalloorganic; $R_2$ is H, halogen, $OR_4$, OH, SH; and $R_3$ is H, halogen, $OR_4$, OH, or SH, wherein $R_4$ is an aliphatic or aromatic hydrocarbon; and

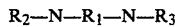

III wherein $R_1$ is phenyl, polyphenyl, fused ring aromatic, alkyl, alkene, aromatic heterocyclic, metalloorganic; $R_2$—N— is HO—N—, O=N—, $X^-N_2+$—; $R_3$—N— is HO—N—, O=N—, $X^-N_2+$—.

The second multifunctional reagent is one that will react with the terminal functional group or groups of the intermediate adduct produced by the first reaction.

The second multifunctional reagent or reagents may be heterofunctional or homofunctional and are selected from the group of reagents represented by the following formula IV:

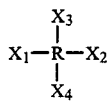

IV wherein R is phenyl, polyphenyl, fused ring aromatic, alkyl, alkene, aromatic hetercyclic, or metalloorganic; $X_1$ and $X_2$ are the same or different and are $NH_2$, NHOH, or OH; $X_3$ is $NH_2$, NHOH, OH, or H; and $X_4$ is $NH_2$, NHOH, OH or H.

First and second reagents are chosen according to the polymeric linkages it is desired to build. When first multifunctional reagents are selected from general formula I, the second multifunctional reagents should be selected to contain nucleophilic groups that will react with the terminal functional moiety or moieties of the intermediate adduct produced from the first coupling reaction, via a further displacement reaction. When the first reagents are selected from general formulae II or III, the second multifunctional reagents should be ones that will react via condensation/elimination. In general, reaction cycles conducted with a combination of a first reagent acting via nucleophilic displacement with a conjugated second reagent will produce semiconjugated polymeric linkages with potential semiconductivity, while reaction with unconjugated reagents produces non-conjugated linkages.

Reaction cycles conducted with a first reagent acting via condensation/elimination and a conjugated second reagent will produce conjugated polymeric linkages, potentially conductive. Reaction cycles conducted with an unconjugated second reagents will produce non-conjugated linkages.

Typical schemes for utilizing the various first and second bifunctional reagents are depicted in the following Table:

TYPICAL SCHEMES FOR SOLID-PHASE SYNTHETIC LINKAGES

| Solid Phase | First Bifunctional Reagent | Second Bifunctional Reagent | Solid-Phase Synthetic Linkage |
|---|---|---|---|

The following presents a typical scheme for synthesis of a branched multiple monolayer structure wherein the polymer or oligomer produced is potentially semiconductor and could be utilized as a two-dimensional molecular wire.

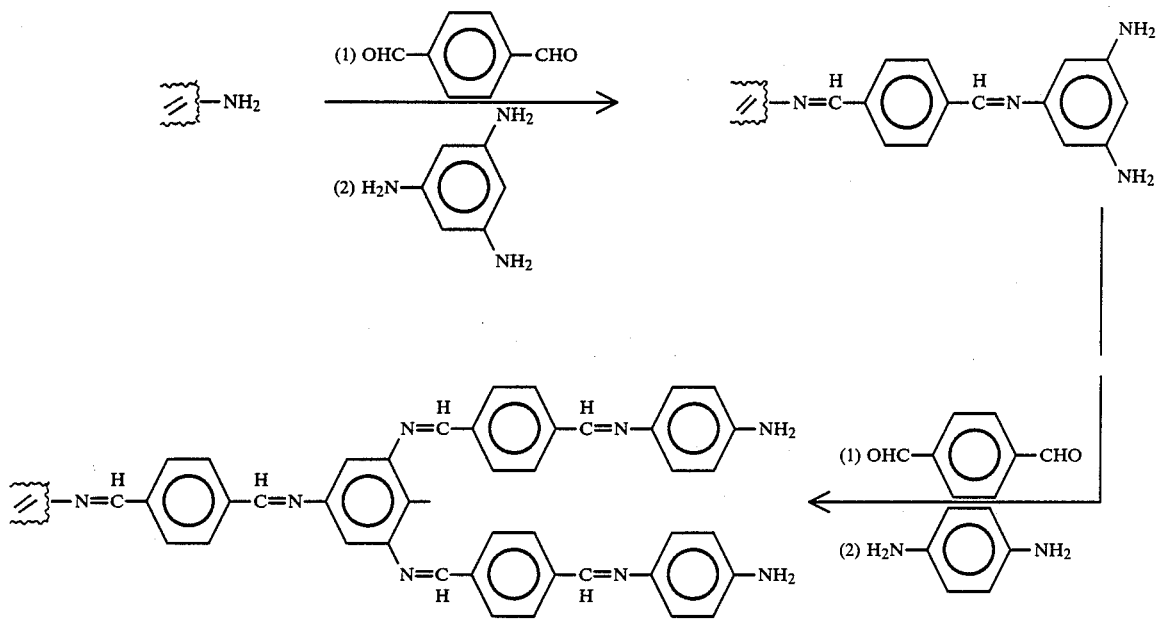

It should be appreciated that various combinations of multiple monolayer units with varying electrical properties could be combined to form various electrical component parts on a molecular level. For example, electrical "switches", "resistors" and the like are within the contemplation of the invention. The following presents a typical scheme for formation of a molecular switch:

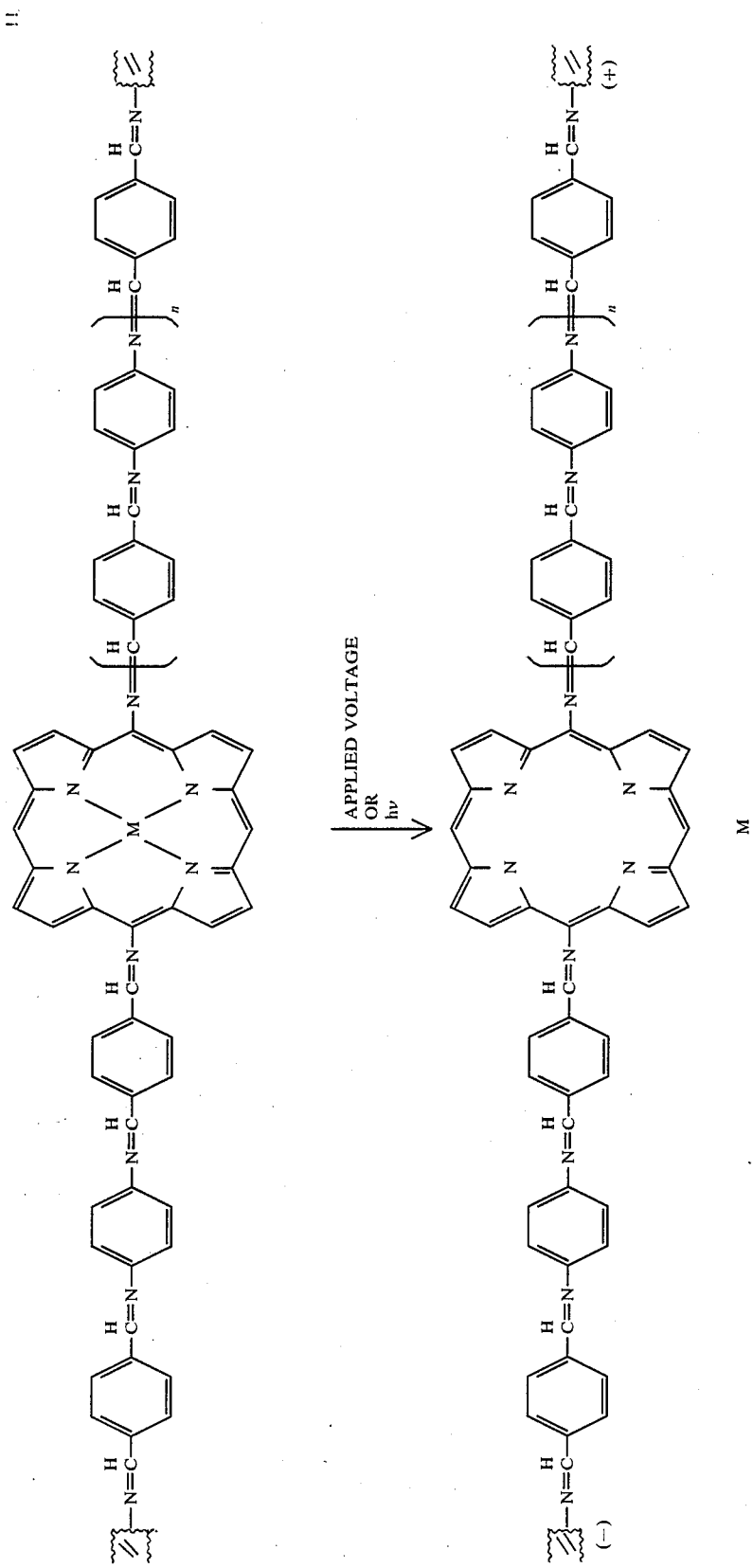

As demonstrated above, semiconjugated or conjugated linkages, in this case, polybenzoiimines, are provided on conductive substrates with a compound containing a displaceable metal, capable of acting as a molecular switch, interposed between portions of the linkages. When a sufficient voltage or other stimulus is applied across this structure, the metal will be displaced from the molecular switch, allowing electric current to be conducted. The first polymeric linkages may be provided on the substrate according to the process of the invention, generating a terminal reactive group capable of reacting with the metalloporphyrin. Additional polymeric monolayers are then built, monolayer by monolayer, from the metalloporphyrin molecular switch, and the terminal ends of the second linkages are then reacted with reactive moieties on the second substrate for attachment thereto.

Compounds suitable for use as molecular switches are those that can react to an applied voltage or other stimulus such as photoactivation or the like, in such a way as to preclude or allow the passage of electrons. Useful in this regard are compounds such as the metalloporphyrins, phthalocyanines, hemiquinones, and the like. Plausible schemes also exist for incorporating charge-transfer salts such as TTF-TCNO (tetrathiafulvalene-tetracyanoquinodimethane). For example, diamino-TTF could be covalently coupled within the backbone of a solid-phase synthesized conjugated polymer, and then TCNO molecules could be allowed to chelate to the TTF units from solution to form the TTF-TCNO charge-transfer salt moieties at a specific position in the molecular circuit. For compounds that may act as molecular switches, see Brian M. Hoffman and James A. Ibers, "Porphyrinic Molecular Metals," Acc. Chem. Res. 1983, 16, 15–21; T. W. Barrett et al., "Electrical Conductivity in Phthalocyanines Modulated by Circularly Polarized Light," Nature, vol. 301, 24 February, 1983; and, 2nd International Workshop on Molecular Electronic Devices, Naval Research Lab, Washington D.C., Apr. 13–15 (1983).

Unconjugated areas that essentially act as a molecular resistor could be further combined with a molecular wire section and molecular switch to modulate electric current passing through. A scheme for a simple molecular circuit is presented below, wherein molecular conductive wires of polybenzoiimines are conjugated to a metalloporphyrin switch in parallel with an n-propyl-diamine resistor:

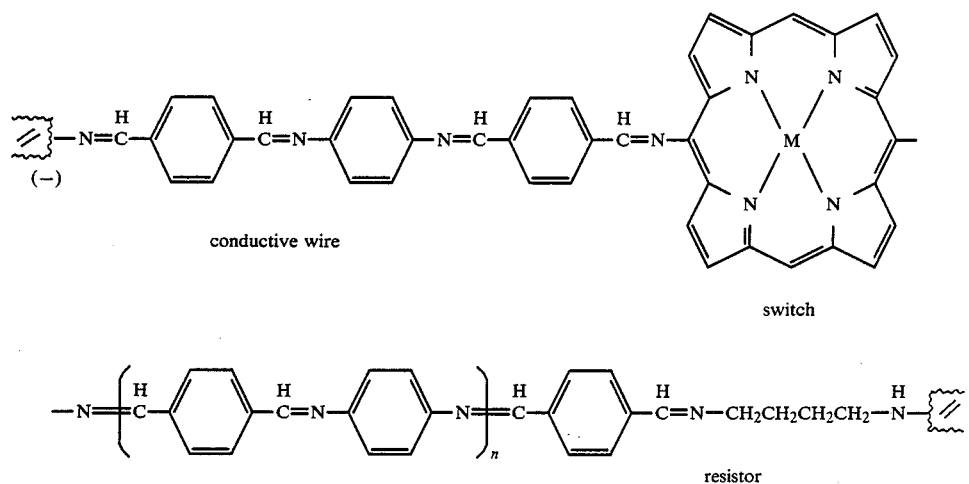

It should be appreciated that the stepwise monolayer addition of the present method can provide a substrate having numerous multiple monolayer structures originating from its surface, with a narrow distribution of total monolayer lengths. In some embodiments, the precision obtained is within a few Angstrom units. This is particularly useful in the area of conductive or semiconductive polymers. Uniformity of oligomeric or polymeric lengths would be helpful in building molecular level circuits and the like as depicted above, as careful control may be exerted over the length of each of the components making up the circuit. Such uniformity is not easy to achieve with the techniques presently available to the art.

It should also be appreciated that the number of multiple monolayer structures prepared on the surface of a substrate will be governed by the number of initial reactive sites on the substrate surface, as well as other factors such as steric hindrances between the monolayer linkages themselves. The number of initial sites could be such that enough multiple monolayers may be prepared to form an actual layer across all or a portion of the substrate surface, the thickness of the layer governed by the number of reaction cycles completed, building successive monolayers on each of the respective structures. The present process thus also provides an alternative to conventional film forming techniques.

Along these same lines, the spacing between the various multiple monolayer structures can be controlled by adjusting the availability of reactive moieties on the solid phase. In some embodiments of the present invention, spacing between linkages has been in the order of approximately 23 Angstrom units. In this case, the spacing could be increased to approximately 50 Angstrom units by passivating the available reactive sites on the solid phase by approximately 50%. In a preferred embodiment wherein multiple monolayers of phenylurethane linkages are produced, the spacing of NH$_2$ groups on the solid phase may be altered by passivating approximately 50% of the available sites with dichlorodimethylsilane prior to the monolayer synthesis procedure. Thus, the linkages could be packed at approximately 50 Angstrom centers, which might be advantageous in molecular electronic applications and the like.

Electroactive properties of conductive or semiconductive polymers prepared according to the above reaction schemes may be enhanced through the use of conventional p or n doping. For example, dopants such as $I_2$, conventionally used to dope polyacetylenes, could be used to dope the conjugated linkages produced by this methodology.

After the desired number of monolayers of a particular molecular unit is prepared, the terminal end of the multiple monolayer structure may be further reacted with a variety of molecules. Useful in this regard are macromolecules such as chelated crown ethers, or biomolecules such as enzymes, hormones, antigens, antibodies, membrane receptors and the like. Immobilization of biomolecules through the use of the immobilized monolayer structure enhances the stability of the biomolecules and thus is an alternative to direct immobilization to a substrate. In some embodiments, the stability of a particular enzyme is directly proportional to the length of the multiple monolayer structure. Greater than about four monolayers is generally preferred, with greater than about ten monolayers particularly preferred. One skilled in the art should be able to readily optimize the stability of a biomolecule of interest by testing its stability relative to various monolayer lengths.

It is preferable that covalent bonding techniques be employed when immobilizing biomolecules. Conventional techniques that are applicable have been described in the art. One such treatise is "Immobilized Enzymes, Antigens, Antibodies, and Peptides, Preparation and Characterization," edited by Howard H. Westall, Marcel Dekker, Inc. (1975).

DETAILED DESCRIPTION OF THE PREFERRED EMBODIMENTS

The following presents a preferred reaction scheme according to the present invention for production of a multiple monolayer structure comprised of electroactive polyphenylurethane linkages:

SINGLE CYCLE REACTION SEQUENCE

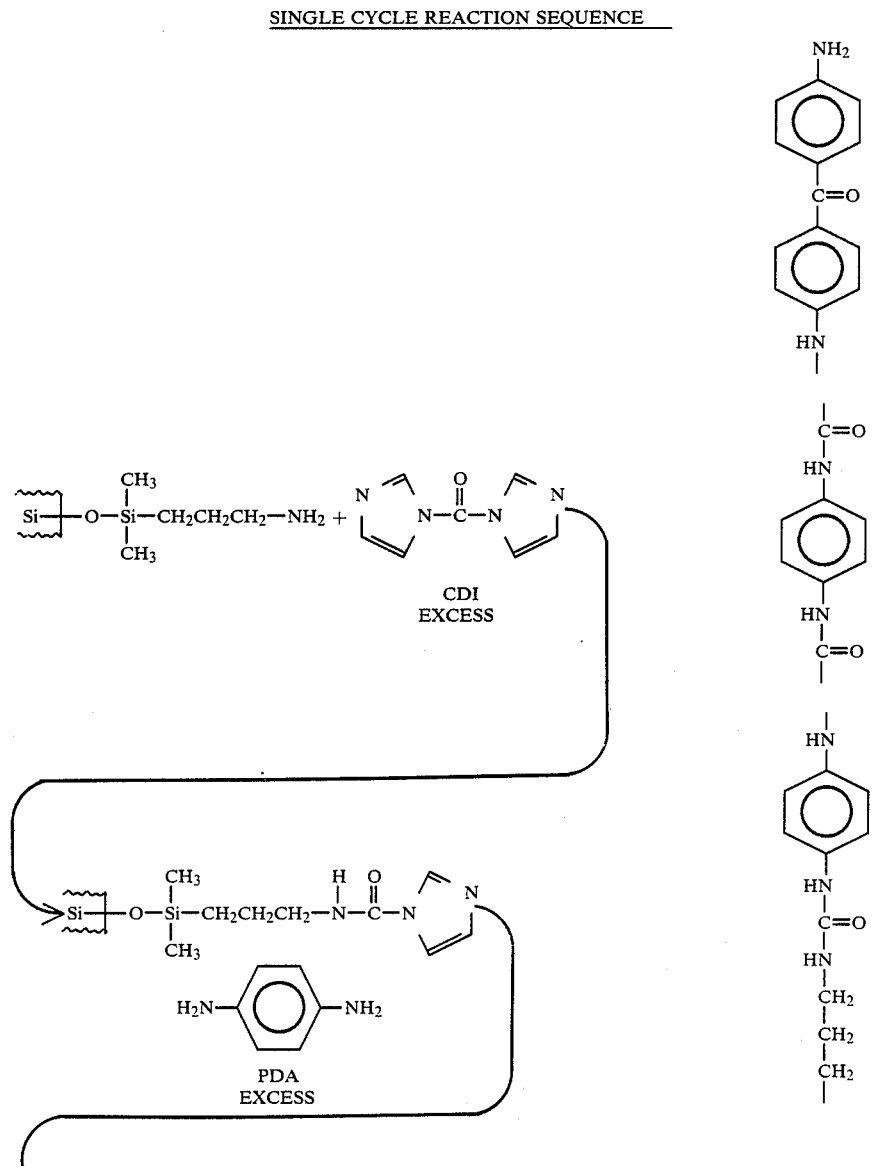

SINGLE CYCLE REACTION SEQUENCE -continued

 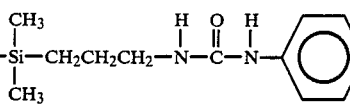 → → → 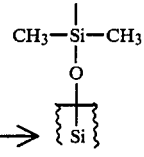
CYCLE 1    3 ADDITIONAL CYCLES    CYCLE 4

Substrate containing a reactive moiety, preferably NH₂, is reacted first with carbonyldiimidazole in a solvent. Solvents particularly useful in this regard are aprotic, so as to avoid the side reaction of hydrolysis of the carbonyldiimidazole. Of the solvents that may be mentioned as preferable are dimethylformamide, dimethylsulfoxide, benzene, chloroform, acetone, ether, and the like.

Amounts of carbonyldiimidazole employed in this first coupling step may vary widely, and should be an amount sufficient to avoid the production of termination reaction products which will interfere with the desired building of the polymeric monolayers. For this reason, an excess of the reagent may generally be employed. For example, for 1 milliequivalent of amino moieties, amounts of about 1 milliequivalent to greater than about 10 milliequivalents of carbonyldiimidazole can be employed, with about 6 milliequivalents to 10 milliequivalents more preferable. The coupling reaction may be carried out by conventional techniques, such as by simply mixing the reactants together. The reaction time period may vary widely, and generally ranges from about 15 minutes to about 60 minutes. The temperature at which the reaction takes place may also vary widely and is generally carried out at room temperature for the sake of convenience.

It is preferable to employ an additional step of removing unreacted carbonyldiimidazole. This can usually be accomplished by conventional filtering and washing techniques, preferably by washing with an aqueous solution and then an aprotic solvent to decompose unreacted carbonyldiimidazole and remove residual products from the solid phase.

The above coupling reaction will produce an imidazole derivative attached to the substrate, which is reactive to a second multifunctional reagent, preferably a diamine such as 1,4 phenylenediamine. Here again, it is preferable to employ an excess of this second reagent to minimize bimolecular termination reactions which can produce products on the solid-phase which will interfere with the desired building of the polymeric monolayers.

Contact of the imidazole derivative with the second reagent is effected by conventional techniques. Contact time periods vary widely, with at least about 15 minutes suitable for the reaction.

Completion of the second coupling reaction produces one monolayer of phenylurethane. The alternative reaction scheme may then be repeated a number of times to produce the desired length of the overall structure, the terminal group ending with an amino functionality or hemi-carbonyldiimidazole functionality.

In particularly preferred embodiments, the thus produced multiple monolayer structure is used to immobilize certain enzymes or other proteins and the like. The immobilization may take place using conventional techniques. For example, contact of the first multifunctional reagent with the terminal moiety of the multiple monolayer structure will produce the intermediate adduct that in turn may react with amino groups contained in the enzyme. Thus, covalent bonding of the enzyme to the monolayer structure is achieved.

Illustrative of the many uses of the immobilized multiple monolayer structures as described hereinabove may be mentioned applications in the area of biological and chemical sensors. Any number of antibodies, enzymes, hormones, membrane receptors, or the like can be attached to the multiple monolayer structures, to produce the optimum molecular design for a particular sensing unit. In some embodiments of the present invention, the stability of a particular immobilized enzyme can be increased manyfold by increasing the distance between the substrate and the enzyme through the use of the multiple monolayer structure.

In addition, molecular wires may be produced by building and varying with a precision of within a few Angstrom units, the bond lengths of electroactive linkages attached to electrode and semiconductor surfaces. Along these same lines, combinations of these monolayer structures with compounds acting as switches may be useful in making molecular scale electronic circuits.

The following examples depict specific embodiments of the present invention but are not to be considered limitive thereof.

EXAMPLE I

Preparation of Multiple Monolayer Structures Consisting of Polyphenylurethane Linkages:

1 gram of Controlled Porous Glass Beads (CPG) was washed with 4–5 volumes of dry dimethylformamide (DMF) on a sintered glass funnel, then transferred to a flask and 5.0 ml 0.25M carbonyldiimidazole (CDI) in DMF added. The mixture was shaken for 15 minutes at room temp, then filtered and washed with water, and 4–5 volumes of DMF. The CDI treated CPG was transferred to a flask and 5.0 ml 0.25M $^{14}$C p-phenylene diamine was added (100–500 DPM/micromole diamine) and shaken for 80 minutes. The mixture was filtered and washed with DMF until no $^{14}$C was evident in filtrate.

The process was repeated up to 18 cycles. A sample from each cycle was counted for $^{14}$C and analyzed for NH₂ end groups. Radioisotopic data indicated that for each complete reaction sequence, 1 monolayer was successfully added to the structure, with a correlation coefficient of 0.94. For a build-up of the first (8) monolayers, a similar correlation coefficient of 0.9932 was obtained (see FIG. 1).

The surface area per gram of CPG beads was known to be approximately 70 m²/gram. By using routine calculation procedures, it was possible to calculate that the packing density of the phenylurethane linkages was a nominal one-linkage/528A$^2$, with a 23A interspacial distance between adjacent linkages.

CPG—Pierce 23909 controlled pore glass, aminopropyl
DMF—Pierce 20673 Dimethylformamide
p-Phenylenediamine—Aldrich P-2,396-2 recrystallized from toluene mp 143-144
$^{14}$C p-Phenylenediamine - Pathfinder 15.03 Hc/micromole
CDI—Pierce 20220—N,N$^1$- carbonyldiimidazole

EXAMPLE II

Acetylcholinesterase Immobilization & Stability Studies

Using the aforementioned series of glass beads with variable bond lengths of phenylurethane linkages, eel-type acetylcholinesterase was immobilized to the amino groups at the ends of these linkages with carbonyl diimidazole (CDI). The immobilized enzyme-glass beads were stored in a refrigerator (ca. 10-deg. C.). Periodic assays were carried out to determine how much of the initial enzyme activity was retained over a period of six months. The data are summarized below:

| Bond Lengths Versus Percent Activity of AChE Enzyme | | | | |
|---|---|---|---|---|
| No. of Monolayers | 2 | 4 | 6 | 8 |
| Bond Length (Angstroms) | 21 | 35 | 49 | 60 A |
| Percent Activity After Six Months | 30 | 50 | 60 | 65% |

Figure 2:
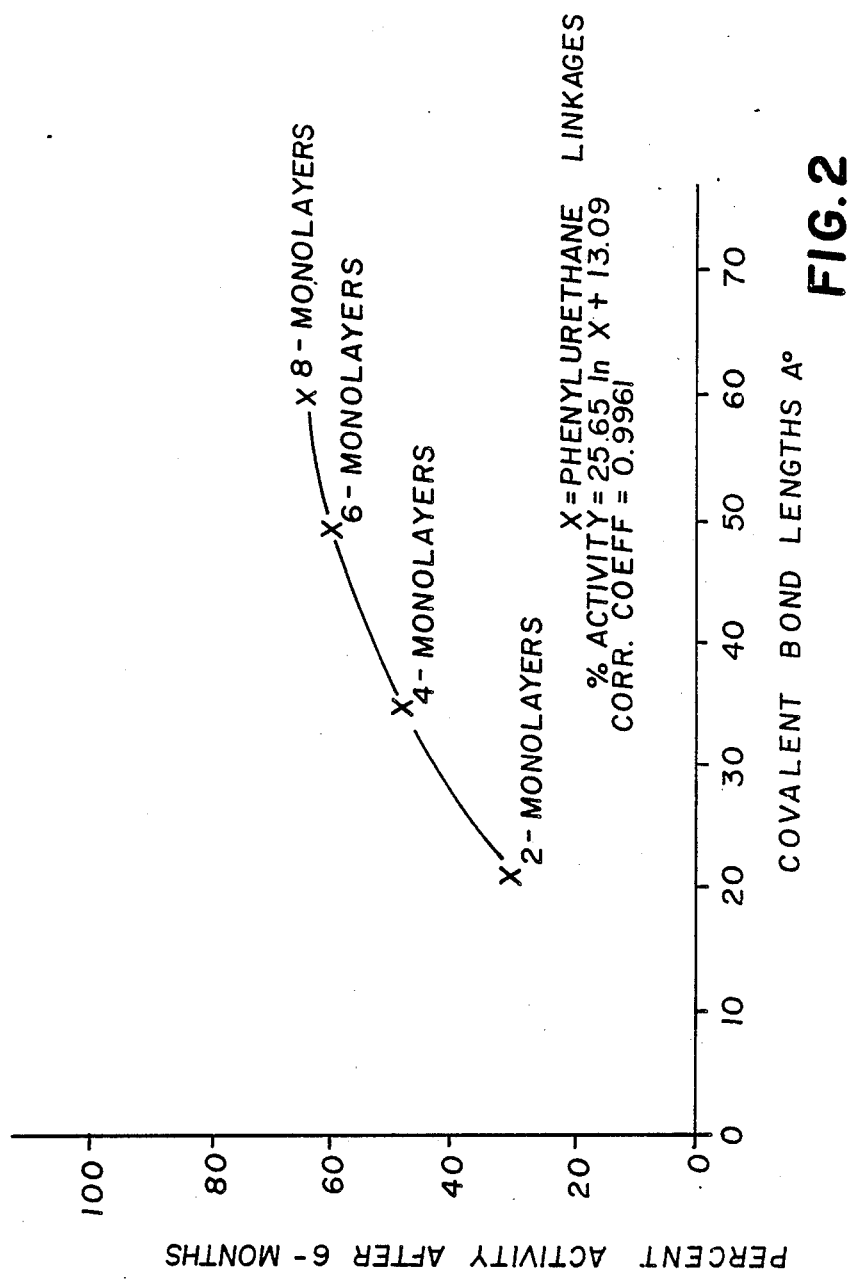
FIG. 2 is a plot of immobilized acetylcholinesterase activities after a 6-month period of time relative to bond lengths of phenylurethane linkages.

The effect of immobilizing bond length on enzyme stability is very pronounced. After six months, the shortest linkage (21 Å) retained 30% of enzyme activity versus 65% activity for the longest linkage (60 Å), an increase greater than twofold (see FIG. 2).

Figure 3:
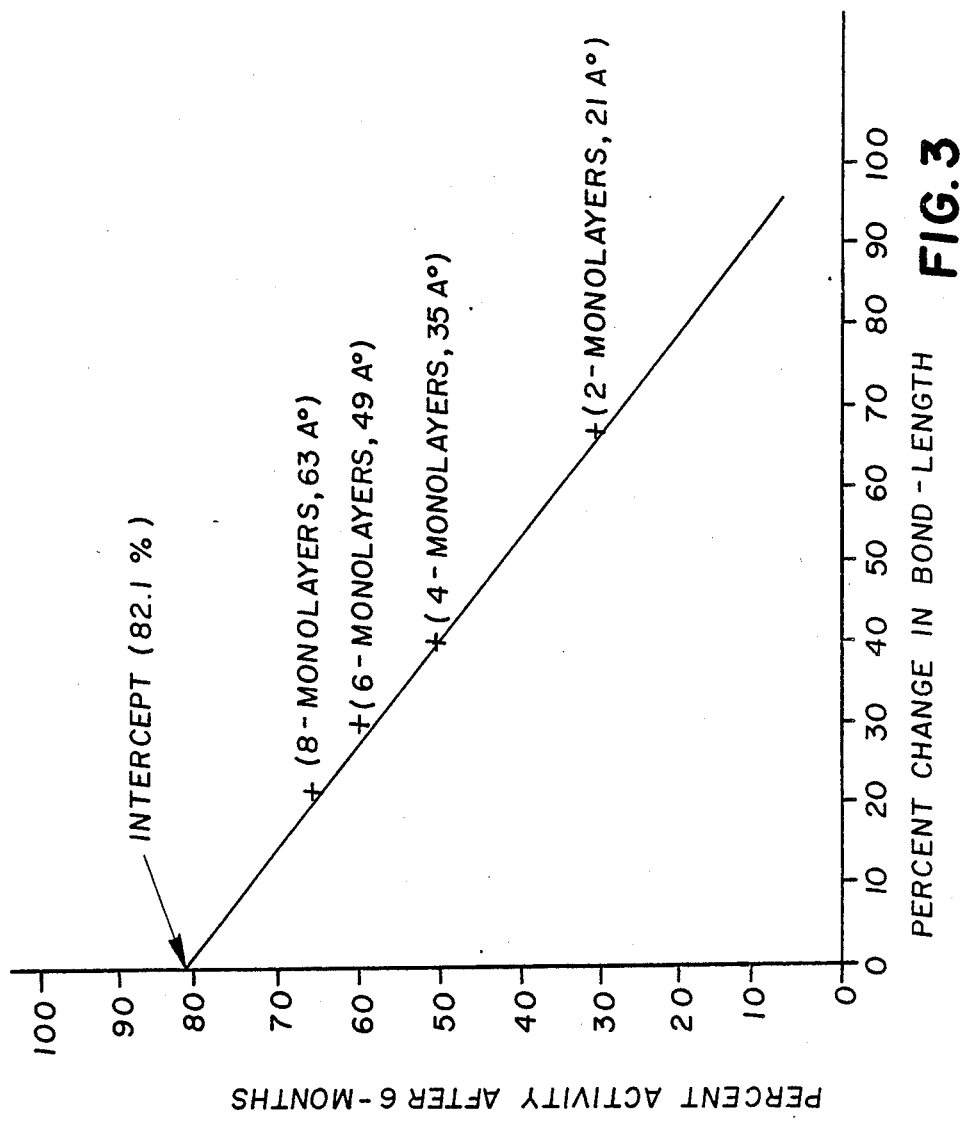
FIG. 3 is a plot of the change in bond lengths of an immobilizing monolayer structure relative to percent enzyme activity of the enzyme immobilized with the multiple monolayer structure.

It should be appreciated that there is a mathematical correlation between the immobilizing bond length and long-term stability of the immobilized enzyme. In fact, the correlation between the percent of enzyme activity values and the logarithms of the immobilizing bond lengths (or number of monolayers) is a linear relationship. In another data manipulation, the percent enzyme activity was plotted against the percent change in total bond length per successive monolayer of phenylurethane. This plot is very linear with a statistical correlation coefficient of 0.9992 (FIG. 3).

What is claimed is:

1. A process for building an immobilized structure comprising multiple monolayers of sequential polymeric linkages, said process comprising the steps of:
   (a) providing a solid phase with a first attached reactive moiety;
   (b) conducting a first coupling reaction by reacting said attached reactive moiety with an excess of carbonyldiimidazole as a first multifunctional reagent to produce an intermediate adduct attached to said solid phase which comprises a residue from said first reagent, and which provides a second reactive moiety capable of coupling to the second multifunctional reagent;
   (c) conducting a second coupling reaction by reacting said intermediate adduct with an excess of phenylenediamine as a second multifunctional reagent to produce a first monolayer of a phenylurethane molecular unit as said polymer linkage; said molecular unit providing a terminal reactive moiety capable of coupling to said first multifunctional reagent:
   (d) repeating said first coupling and second coupling reactions alternatively to produce additional monolayers of said phenylurethane molecular unit to obtain said immobilized structure comprising multiple monolayers of sequential polymeric linkage.

2. The process of claim 1 wherein said solid phase contains an amino functionality.

3. A process for immobilizing an enzyme comprising the steps of:
   (a) providing a solid phase with an attached amino functionality;
   (b) conducting a first coupling reaction by reacting said attached amino functionality with an excess of carbonyldiimidazole to produce an intermediate adduct which comprises a carbonyl-containing residue derived from said carbonyldiimidazole, and a reactive moiety capable of coupling to a second multifunctional reagent containing at least one amino functionality;
   (c) conducting a second coupling reaction by reacting said intermediate adduct with an excess of phenylenediamine as said second multifunctional reagent to produce a first monolayer of a phenylurethane molecular unit;
   (d) repeating said first coupling and second coupling reaction to produce at least four monolayers of phenylurethane linkages and a terminal amino functionality;
   (e) reacting said terminal amino functionality with carbonyldiimidazole to produce a terminal intermediate adduct capable of coupling to an enzyme;
   (f) reacting said resulting intermediate adduct with an enzyme to produce an enzyme immobilized onto a multiple monolayer structure.

4. The process of claim 3 wherein the enzyme is acetylcholinesterase.

5. A multiple monolayer structure produced according to the process of claim 1.

6. An immobilized enzyme produced according to the process of claim 12.

* * * * *

UNITED STATES PATENT AND TRADEMARK OFFICE
CERTIFICATE OF CORRECTION

PATENT NO. : 4,933,285
DATED : June 12, 1990
INVENTOR(S) : Patton

It is certified that error appears in the above-identified patent and that said Letters Patent is hereby corrected as shown below:

Column 1, line 7, "16,337" should read --916,337--.

Column 2, line 67, "may he reacted" should read --may be reacted--.

Column 3, line 6, "employed It is" should read --employed. It is--.

Column 20, line 55 "12" should read --2--.

Signed and Sealed this

Twenty-fifth Day of May, 1993

Attest:

MICHAEL K. KIRK

Attesting Officer

Acting Commissioner of Patents and Trademarks